United States Patent
Kim et al.

(10) Patent No.: US 12,184,235 B2
(45) Date of Patent: Dec. 31, 2024

(54) AMPLIFIER HAVING IMPROVED SLEW RATE

(71) Applicant: DB HiTek Co., Ltd., Seoul (KR)

(72) Inventors: Mun Gyu Kim, Seoul (KR); Yong In Park, Hanam-si (KR)

(73) Assignee: DB GLOBALCHIP CO., LTD., Seongnam-si (KR)

( * ) Notice: Subject to any disclaimer, the term of this patent is extended or adjusted under 35 U.S.C. 154(b) by 445 days.

(21) Appl. No.: 17/674,199

(22) Filed: Feb. 17, 2022

(65) Prior Publication Data
US 2022/0286091 A1   Sep. 8, 2022

(30) Foreign Application Priority Data
Mar. 4, 2021   (KR) .......................... 10-2021-0028928

(51) Int. Cl.
*H03F 3/45*   (2006.01)
*H03F 1/02*   (2006.01)

(52) U.S. Cl.
CPC ....... *H03F 1/0205* (2013.01); *H03F 3/45076* (2013.01); *H03F 2203/45248* (2013.01)

(58) Field of Classification Search
CPC .............. H03F 1/0205; H03F 3/45076; H03F 2203/45248; H03F 2203/45138; H03F 3/303; H03F 3/45475; H03F 2203/45091; H03F 2203/45182; H03F 2203/45221; H03F 2203/45222; H03F 2203/45544; H03F 2203/45676; H03F 3/4521; H03F 3/45183; H03F 3/45273
USPC ....................................................... 330/252
See application file for complete search history.

(56) References Cited

U.S. PATENT DOCUMENTS

2009/0039959 A1*   2/2009   An .................... H03F 3/3022
                                                                330/261

* cited by examiner

*Primary Examiner* — Andrea Lindgren Baltzell
*Assistant Examiner* — Khiem D Nguyen
(74) *Attorney, Agent, or Firm* — Andrew D. Fortney; Central California IP Group, P.C.

(57) ABSTRACT

Disclosed is an amplifier having a high slew rate without increasing power consumption. The amplifier includes an input unit, a conversion unit, an amplification unit, a frequency compensation circuit, and a slew rate improvement circuit. Alternatively, the amplifier includes an input unit, a conversion unit, an amplification unit, a frequency compensation circuit, a first slew rate improvement circuit, and a second slew rate improvement circuit.

20 Claims, 5 Drawing Sheets

AMPLIFIER HAVING IMPROVED SLEW RATE

This application claims the benefit of Korean Patent Application No. 10-2021-0028928, filed on Mar. 4, 2021, which is hereby incorporated by reference as if fully set forth herein.

BACKGROUND OF THE INVENTION

Field of the Invention

The present invention relates to an amplifier, and more particularly to an amplifier capable of improving a slew rate without increasing power consumption.

Discussion of the Related Art

A liquid crystal display device constituting a display panel includes a plurality of picture elements (pixels) in a matrix including rows and columns, and the operation of each pixel is controlled by a thin film transistor.

Thin film transistors in the same row are commonly connected to each other via a gate line, and thin film transistors in the same column are commonly connected to each other via a data line. Each of the gate line and the data line is controlled, for example, by a display drive IC (DDI).

In order to charge the display panel within a shorter time, it is necessary to improve a slew rate of a buffer to which the DDI is applied. The slew rate is a parameter indicating how fast the output (e.g., of a buffer implemented using an amplifier) follows the corresponding input.

In order to improve the slew rate of the amplifier, it is possible to increase the current in the amplifier, particularly the current consumption in an output stage constituting the amplifier. With rapidly increasing demand for low-power, high-resolution display devices, however, an increase in power consumption in the buffer is undesirable in a portable electronic device using a battery. Therefore, an amplifier or a buffer having improved slew rate without increasing power consumption is desired.

SUMMARY OF THE INVENTION

Accordingly, the present invention is directed to an amplifier having an improved slew rate that substantially obviates one or more problems due to limitations and disadvantages of the related art.

It is an object of the present invention to provide an amplifier having a high slew rate without increasing power consumption.

Objects of the present invention devised to solve the problems are not limited to the aforementioned object, and other unmentioned objects will be clearly understood by those skilled in the art based on the following description of the present invention.

To achieve these objects and other advantages and in accordance with the purpose of the invention, as embodied and broadly described herein, an amplifier includes an input unit, a conversion unit, an amplification unit, a frequency compensation circuit, and a slew rate improvement circuit. The input unit receives a differential input signal at a first input terminal and a second input terminal. The input unit includes a first input stage having a first AC ground node therein and a second input stage having a second AC ground node therein. The conversion unit includes a first current mirror including a first current determiner and a first current follower configured to operate in response to a voltage or current on a first current determination and/or voltage generation node of the first current determiner, a second current mirror including a second current determiner and a second current follower configured to operate in response to a voltage or current on a second current determination and/or voltage generation node of the second current determiner, a first transmission gate between the first current determiner and the second current determiner, and a second transmission gate between the first current follower and the second current follower. The conversion unit provides a first conversion voltage and a second conversion voltage that vary in response to the differential signal at the input unit. The amplification unit provides an output voltage in response to the first conversion voltage and the second conversion voltage. The frequency compensation circuit includes a first compensation capacitor between an output terminal configured to provide the output voltage and the first current follower and a second compensation capacitor between the output terminal and the second current follower. The slew rate improvement circuit includes a first slew rate improvement capacitor between the first current determination and/or voltage generation node and the first AC ground node and a second slew rate improvement capacitor between the second current determination and/or voltage generation node and the second AC ground node.

In another aspect, an amplifier includes an input unit, a conversion unit, an amplification unit, a frequency compensation circuit, a first slew rate improvement circuit, and a second slew rate improvement circuit. The input unit receives a differential input signal at a first input terminal and a second input terminal. The input unit includes a first input stage having a first AC ground node therein and a second input stage having a second AC ground node provided therein. The conversion unit includes a first current mirror including a first current determiner and a first current follower configured to operate in response to a voltage or current on a first current determination and/or voltage generation node of the first current determiner, a second current mirror including a second current determiner and a second current follower configured to operate in response to a voltage or current on a second current determination and/or voltage generation node of the second current determiner, a first transmission gate between the first current determiner and the second current determiner, and a second transmission gate between the first current follower and the second current follower. The conversion unit provides a first conversion voltage and a second conversion voltage that vary in response to the differential signal at the input unit. The amplification unit provides an output voltage in response to the first conversion voltage and the second conversion voltage. The frequency compensation circuit includes a first compensation capacitor between an output terminal configured to provide the output voltage and the first current follower and a second compensation capacitor between the output terminal and the second current follower. The first slew rate improvement circuit includes a switching element configured to reversibly connect each of a first terminal configured to output the first conversion voltage and a second terminal configured to output the second conversion voltage to the output terminal for a predetermined time during which the output voltage transitions in response to the input voltage at the first input terminal. The second slew rate improvement circuit includes a first slew rate improvement capacitor between the first current determination and/or voltage generation node and the first AC ground node and a second slew rate improvement capacitor between the second current determination and/or voltage generation node and the second AC ground node.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
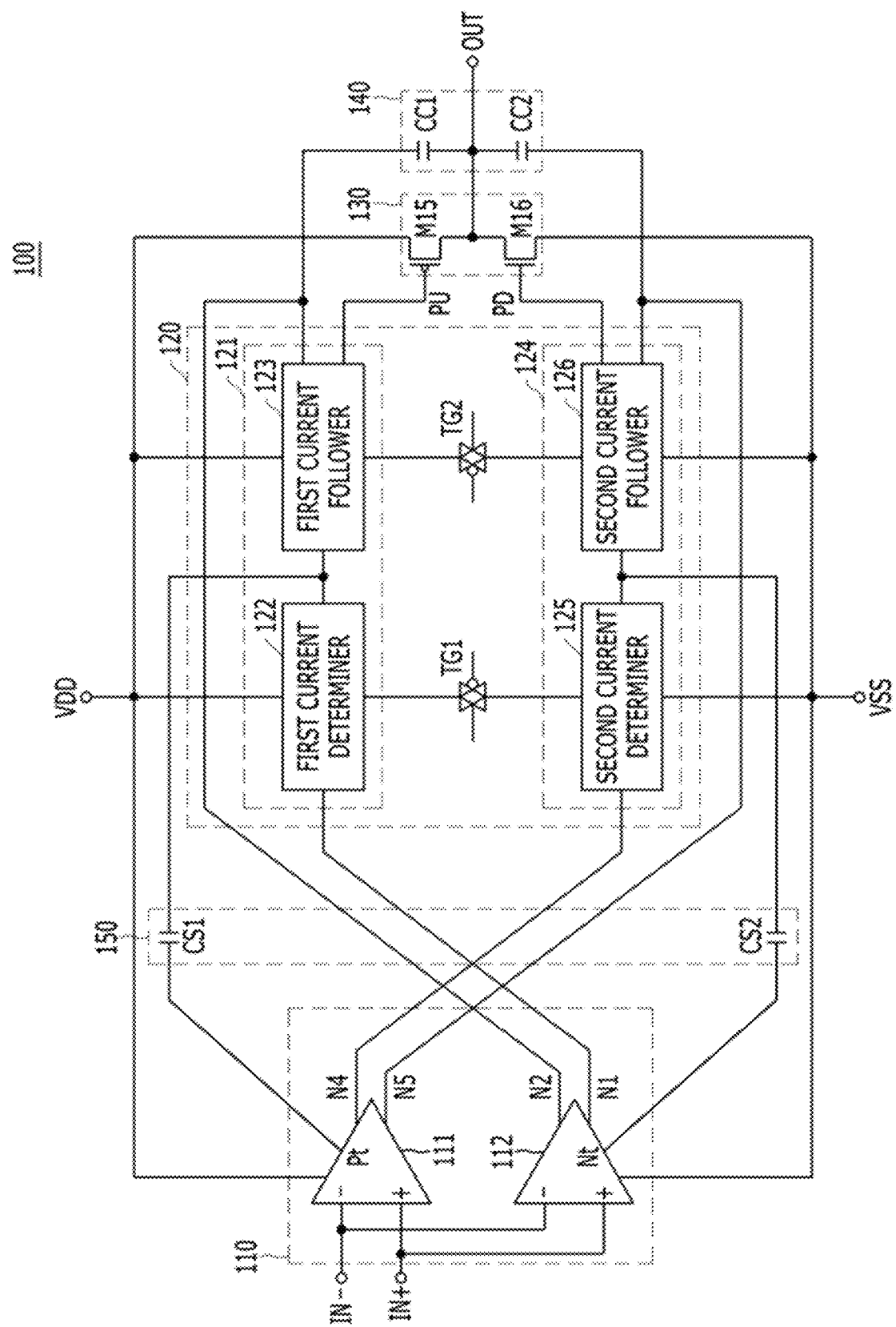
FIG. 1 shows an embodiment of an amplifier according to the present invention.

In order to sufficiently understand the present invention, advantages in operation of the present invention, and objects achieved by implementation of the present invention, the accompanying drawings describing exemplary embodiments of the present invention and the contents stated in the accompanying drawings must be referred to.

Hereinafter, various embodiments of the present invention will be described in detail with reference to the accompanying drawings. The same reference numerals in the respective drawings denote the same members.

FIG. 1 shows an embodiment of an amplifier according to the present invention.

Referring to FIG. 1, an amplifier 100 having an improved slew rate according to the present invention includes an input unit 110, a conversion unit 120, an amplification unit 130, a frequency compensation circuit 140, and a slew rate improvement circuit 150.

The input unit 110 includes a first input stage 111 and a second input stage 112, and receives a differential input signal (e.g., IN− and IN+) at a first input terminal IN+ and a second input terminal IN−. The first input stage 111 and the second input stage 112 include a first AC ground node Pt and a second AC ground node Nt, respectively. The input unit 110 may change a first conversion voltage PU and a second conversion voltage PD output by the conversion unit 120, a description of which will follow, while exchanging current with the conversion unit 120.

The conversion unit 120 generates a first conversion voltage PU and a second conversion voltage PD that vary in response to a value of the differential input signal IN−/IN+ input to the input unit 110, and includes a first current mirror 121, a second current mirror 124, a first transmission gate TG1, and a second transmission gate TG2. The first current mirror 121 includes a first current determiner 122 and a first current follower 123. The first current follower 123 operates in response to the voltage or current on a third node (hereinafter referred to as a first current determination and/or voltage generation node) N3, determined by the first current determiner 122. The second current mirror 124 includes a second current determiner 125 and a second current follower 126. The second current follower 126 operates in response to the voltage or current on a sixth node (hereinafter referred to as a second current determination and/or voltage generation node) N6, determined by the second current determiner 125. The first transmission gate TG1 may be between the first current determiner 122 and the second current determiner 125, and the second transmission gate TG2 may be between the first current follower 123 and the second current follower 126.

The amplification unit 130 provides an output voltage OUT in response to the conversion voltages PU and PD output from the conversion unit 120.

The frequency compensation circuit 140 improves frequency characteristics of the output voltage OUT using a first compensation capacitor cc1 between an output terminal OUT configured to provide the output voltage OUT and a second node N2, which is a common node of the input unit 110 and the conversion unit 120, and a second compensation capacitor cc2 between the output terminal OUT configured to provide the output voltage OUT and a fifth node N5, which is a common node of the input unit 110 and the conversion unit 120. Although the term "frequency compensation circuit 140" is used herein for simplicity, the two compensation capacitors cc1 and cc2 also improve a slew rate of the output voltage OUT in addition to improving frequency characteristics of the amplifier 100.

The slew rate improvement circuit 150 includes a first slew rate improvement capacitor cs1 between the first current determination and/or voltage generation node N3 and the first AC ground node Pt of the first input stage 111 and a second slew rate improvement capacitor cs2 between the second current determination and/or voltage generation node N6 and the second AC ground node Nt of the second input stage 112.

In FIG. 1, when the second input terminal IN− and the output terminal OUT are coupled to each other, the amplifier may function as a buffer configured such that the voltage on the output terminal OUT may change or transition in response to the first input terminal IN+.

The operation of the amplifier 100 shown in FIG. 1 will be described hereinafter in detail using a circuit including specific circuit elements.

Figure 2:
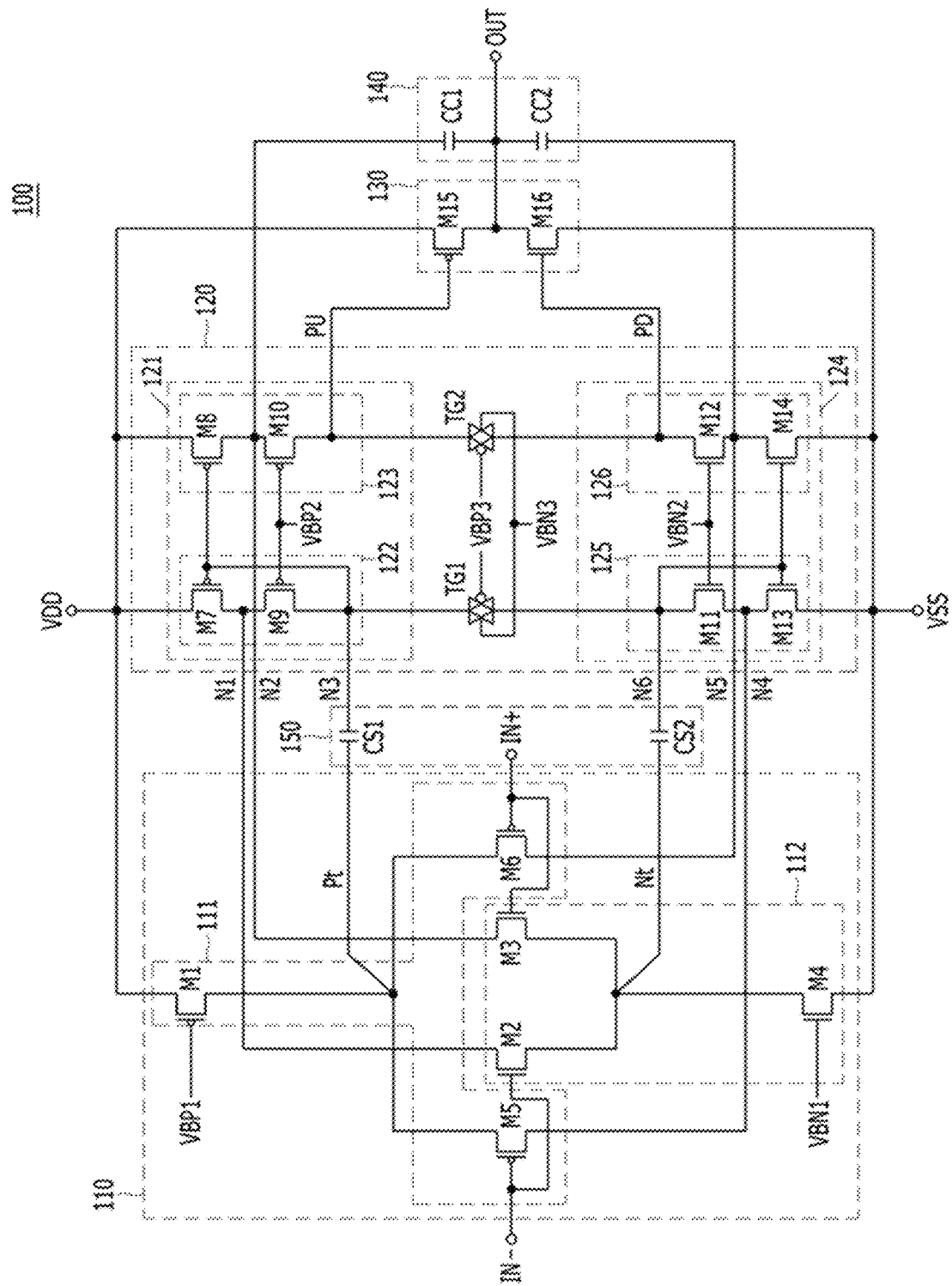
FIG. 2 shows an exemplary circuit of the amplifier shown in FIG. 1.

FIG. 2 shows an exemplary circuit of the amplifier shown in FIG. 1.

Referring to FIG. 2, the amplifier 100 according to the present invention includes an input unit 110, a conversion unit 120, an amplification unit 130, a frequency compensation circuit 140, and a slew rate improvement circuit 150.

Transistors shown in FIG. 2 each may comprise a transistor (e.g., a metal oxide silicon (MOS) transistor) including a gate terminal (hereinafter referred to as a gate), a drain terminal (hereinafter referred to as a drain), and a source terminal (hereinafter referred to as a source). In the following description, a P-type transistor and an N-type transistor will not be distinguished from each other, and the drain and the source will be defined and described as one terminal (e.g., a first source/drain terminal) and another terminal (e.g., a second source/drain terminal).

Figure 4:
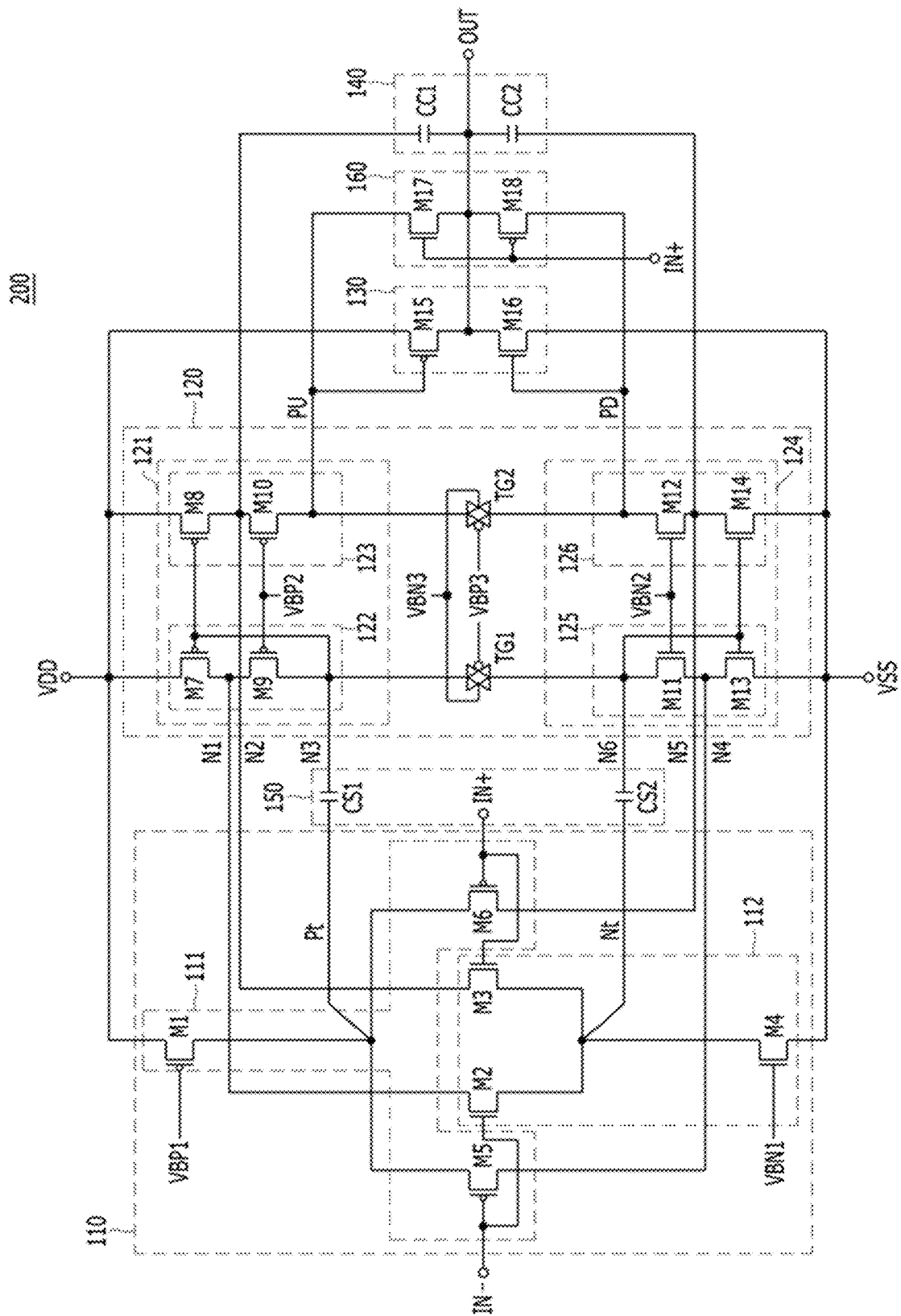
FIG. 4 shows an exemplary circuit of the amplifier shown in FIG. 3.

In an example shown in each of FIG. 2 and FIG. 4, a description of which will follow, the circuit includes both P-type transistors and N-type transistors. If the circuit shown in each of FIGS. 2 and 4 is used, however, conversion into a circuit using one kind of transistors, such as P-type transistors or N-type transistors, or conversion into a circuit using bipolar transistors may be easily performed, a detailed description of which will be omitted.

The input unit 110 may comprise 6 transistors M1 to M6.

The first input stage 111 may comprise a first transistor M1, a fifth transistor M5, and a sixth transistor M6. One terminal of the first transistor M1 receives a first supply voltage VDD, and a first bias voltage VBP1 is applied to a gate of the first transistor M1. One terminal of the fifth transistor M5 is connected to another terminal of the first transistor M1, another terminal of the fifth transistor M5 is connected to a fourth node N4, and a second input terminal IN− is connected to a gate of the fifth transistor M5. One terminal of the sixth transistor M6 is connected to another terminal of the first transistor M1, another terminal of the sixth transistor M6 is connected to a fifth node N5, and a first input terminal IN+ is connected to a gate of the sixth transistor M6. Here, a common terminal of the first transistor M1, the fifth transistor M5, and the sixth transistor M6 becomes the first AC ground node Pt.

The second input stage 112 may comprise a second transistor M2, a third transistor M3, and a fourth transistor M4. One terminal of the fourth transistor M4 receives a second supply voltage VSS, and a second bias voltage VBN1 is applied to a gate of the fourth transistor M4. One terminal of the second transistor M2 is connected to a first node N1, the second input terminal IN− is connected to a gate of the second transistor M2, and another terminal of the second transistor M2 is connected to another terminal of the fourth transistor M4. One terminal of the third transistor M3 is connected to a second node N2, the first input terminal IN+ is connected to a gate of the third transistor M3, and another terminal of the third transistor M3 is connected to another terminal of the fourth transistor M4. Here, a common terminal of the second transistor M2, the third transistor M3, and the fourth transistor M4 becomes the second AC ground node Nt.

Here, the second transistor M2 to the fourth transistor M4 may be N-type transistors, and the first transistor M1, the fifth transistor M5, and the sixth transistor M6 may be P-type transistors. The first supply voltage VDD is higher than the second supply voltage VSS.

The first node N1, the second node N2, the fourth node N4, and the fifth node N5 will be described when describing the conversion unit 120.

The conversion unit 120 may comprise a first current mirror 121, a second current mirror 124, a first transmission gate TG1, and a second transmission gate TG2.

The first current mirror 121 comprises four transistors M7 to M10.

One terminal of the seventh transistor M7 receives the first supply voltage VDD, and another terminal of the seventh transistor M7 is connected to the first node N1. One terminal of the eighth transistor M8 receives the first supply voltage VDD, and another terminal of the eighth transistor M8 is connected to the second node N2. One terminal of the ninth transistor M9 is connected to the first node N1, another terminal of the ninth transistor M9 is connected to the third node N3, and a gate of the ninth transistor M9 receives a third bias voltage VBP2. The third node N3 is also connected to gates of the seventh transistor M7 and the eighth transistor M8. One terminal of the tenth transistor M10 is connected to the second node N2, another terminal of the ninth transistor M9 is connected to a pull-up terminal PU, and a gate of the tenth transistor M10 receives the third bias voltage VBP2. Since the third node N3 is commonly connected to the gates of the seventh transistor M7 and the eighth transistor M8, current that flows from the first supply voltage VDD to the seventh transistor M7 and the eighth transistor M8 may be determined by the voltage on the third node N3. For this reason, the third node may be called a first current determination and/or voltage generation node.

The second current mirror 124 may comprise four transistors M11 to M14. One terminal of the eleventh transistor M11 is connected to the sixth node N6, another terminal of the eleventh transistor M11 is connected to the fourth node N4, and a gate of the eleventh transistor M11 receives a fourth bias voltage VBN2. One terminal of the twelfth transistor M12 is connected to a pull-down (PD) terminal PD, another terminal of the twelfth transistor M12 is connected to the fifth node N5, and a gate of the twelfth transistor M12 receives the fourth bias voltage VBN2. One terminal of the thirteenth transistor M13 is connected to the fourth node N4, another terminal of the thirteenth transistor M13 receives the second supply voltage VSS, and a gate of the thirteenth transistor M13 is connected to the sixth node N6. One terminal of the fourteenth transistor M14 is connected to the fifth node N5, another terminal of the fourteenth transistor M14 receives the second supply voltage VSS, and a gate of the fourteenth transistor M14 is connected to the sixth node N6. For the same reason as in the first current mirror 121, the sixth node N6 may be called a second current determination and/or voltage generation node.

The first transmission gate TG1 is between the third node N3 and the sixth node N6 and responds to a fifth bias voltage VBP3 and a sixth bias voltage VBN3. The second transmission gate TG2 is between the pull-up (PU) node PU and the pull-down node PD in response to the fifth bias voltage VBP3 and the sixth bias voltage VBN3. A transmission gate is configured to have a structure in which two terminals of a P-type transistor and an N-type transistor are coupled to each other, and therefore the fifth bias voltage VBP3 is provided to a gate of the P-type transistor while the sixth bias voltage VBN3 is provided to a gate of the N-type transistor.

When the second transmission gate TG2 is short-circuited (turned on), the pull-up node PU and the pull-down node PD are connected to each other, and a predetermined magnitude of resistance may arise between the pull-up node PU and the pull-down node PD in series as a result of a switching resistance of the second transmission gate TG2. When the second transmission gate TG2 is turned on, a difference in voltages on the pull-up node PU and the pull-down node PD may exist.

Hereinafter, operation of the input unit 110 and the conversion unit 120 will be described.

Referring to FIG. 2, the current supplied from the first transistor M1 in the first input stage 111 flows through the fifth transistor M5 and the sixth transistor M6 to the thirteenth transistor M13 and the fourteenth transistor M14 in the conversion unit 120. Current that flows through the seventh transistor M7 and the eighth transistor M8 in the conversion unit 120 flows through the second transistor M2 and the third transistor M3 to the fourth transistor M4 in the second input stage 112. For this reason, the first transistor M1 is called a current source, and the fourth transistor M4 is called a current sink.

In a functional aspect, the conversion unit 120 may be divided into a first current mirror 121 coupled to the second transistor M2 and the third transistor M3 in the second input stage 112 to generate a first conversion voltage PU and a second current mirror 124 coupled to the fifth transistor M5 and the sixth transistor M6 in the first input stage 111 to generate a second conversion voltage PD.

In the first current mirror 121, the gates of the seventh transistor M7 and the eighth transistor M8 are commonly connected to the third node N3, and therefore same current flows on the first node N1 and the second node N2 if the seventh transistor M7 and the eighth transistor M8 are equal to each other in size (i.e., they have an identical ratio of the gate length to the gate width), and no other external factors act.

In the second current mirror 124, the ninth transistor M9 and the seventh transistor M7 are in series, the tenth transistor M10 and the eighth transistor M8 are in series, another terminal of the ninth transistor M9 is the third node N3, and another terminal of the tenth transistor M10 is the pull-up terminal PU, and therefore the current that flows on the first node N1 and the second node N2 flows to the ninth transistor M9 and the tenth transistor M10 if no other external factors act.

Referring to FIG. 2, the first node N1 and the second node N2 are connected respectively to one terminal of the second transistor M2 and one terminal of the third transistor M3 in the second input terminal IN− and the first input terminal IN+, respectively, while in the second input stage 112. When the same voltage is applied to the gates of the second transistor M2 and the third transistor M3, generally the same amount of current is introduced into one terminal of the second transistor M2 and one terminal of the third transistor M3 through the first node N1 and the second node N2.

When a difference arises between the voltages applied to the gates of the second transistor M2 and one terminal of the third transistor M3, the amount of current received by the second transistor M2 and the third transistor M3 differs in proportion to the difference between the voltages (i.e., applied to the gates of M2 and M3), whereby a difference in voltage levels on the first node N1 and the second node N2 arises.

If the voltage applied to the gate of the third transistor M3 corresponding to the first input terminal IN+ is higher than the voltage applied to the gate of the second transistor M2 corresponding to the second input terminal IN−, the amount of current that flows through the third transistor M3 must be greater than the amount of current that flows through the second transistor M2. Consequently, the amount of current through the second transistor M2 from the first node N1 may become less than the amount of current through the third transistor M3 from the second node N2, and the voltage on the third node N3 increases in order to reduce the amount of current that flows through the seventh transistor M7. Therefore, the voltage on the second node N2 may decrease (e.g., in order to increase the amount of current that flows to the second node N2 through the eighth transistor M8), and the voltage at another terminal of the tenth transistor M10, i.e. the pull-up terminal PU, may also decrease. That is, it can be seen that, when there is a difference between the voltage at the first input terminal IN+ and the voltage at the second input terminal IN1, the voltage at the third node N3 and the voltage on the second node N2 fluctuate in opposite directions.

The operation of the second current mirror 124 and the first input stage 111 may be performed in the same manner as the operation of the first current mirror 121.

The voltage levels of the pull-up terminal PU and the pull-down terminal PD may change in response to a difference between the voltage at the gates of the second transistor M2 and the fifth transistor M5 (the second input terminal IN−) and the voltage at the gates of the third transistor M3 and the sixth transistor M6 (the first input terminal IN+). Since the above function is performed, voltages generated at the pull-up terminal PU and the pull-down terminal PD are called conversion voltages, and a circuit comprising the eight transistors M7 to M14 and two transmission gates may be called a conversion unit 120.

In FIG. 2, the seventh transistor M7 to the tenth transistor M10 are shown as P-type transistors, and the eleventh transistor M11 to the fourteenth transistor M14 are shown as N-type transistors.

The bias voltages VBP1, VBN1, VBP2, VBN2, VBP3, VBN3 used in the input unit 110 and the conversion unit 120 have fixed values and are generated outside the circuit shown in FIG. 2 and applied, which is equally applied to the following description of FIG. 4.

The amplification unit 130 may comprise two transistors M15 and M16 configured to provide an output voltage OUT in response to the first conversion voltage PU of the pull-up terminal PU and the second conversion voltage PD of the pull-down terminal PD.

One terminal of the fifteenth transistor M15 receives the first supply voltage VDD, and a gate of the fifteenth transistor M15 is connected to the pull-up terminal PU. One terminal of the sixteenth transistor M16 is connected to another terminal of the fifteenth transistor M15, another terminal of the sixteenth transistor M16 receives the second supply voltage VSS, and a gate of the sixteenth transistor M16 is connected to the pull-down terminal PD. A voltage output from a common terminal (hereinafter referred to as an output terminal) of the two transistors M15 and M16 becomes an output voltage OUT.

In FIG. 2, the fifteenth transistor M15 may comprise a P-type transistor, and the sixteenth transistor M16 may comprise an N-type transistor.

The frequency compensation circuit 140 may comprise a first compensation capacitor cc1 having two terminals connected to the second node N2 and the output terminal OUT and a second compensation capacitor cc2 having two terminals connected to the fifth node N5 and the output terminal OUT. The improvement in frequency characteristics provided by the two compensation capacitors cc1 and cc2 in the frequency compensation circuit 140 may be checked frequency characteristics of the output voltage to the input voltage, measured using a measuring instrument, or may be checked by calculating a transfer function of the amplifier, and therefore a detailed description thereof will be omitted. Although not described in detail, the two compensation capacitors cc1 and cc2 also improve the slew rate of the output voltage OUT.

The slew rate improvement circuit 150 includes a first slew rate improvement capacitor cs1 between the first current determination and/or voltage generation node N3 and the first AC ground node Pt of the first input stage 111 and a second slew rate improvement capacitor cs2 between the second current determination and/or voltage generation node N6 and the second AC ground node Nt of the second input stage 112.

Hereinafter, the function of the slew rate improvement circuit 150 will be described.

Since electrical characteristics and operations of elements in the input unit 110, the conversion unit 120, and the amplification unit 130 are known by those skilled in the art, a description will be given based on operation of the slew rate improvement circuit 150, which is a core idea of the present invention. Throughout the description of the present invention, the name of a specific node or terminal and the voltage on the node are commonly used in order to simplify reference symbols and for convenience of description. For example, when the reference symbol of an output terminal is "OUT," the voltage at the output terminal is denoted by the label "OUT."

When the output terminal OUT is not connected to the second input terminal IN− (i.e. is in an open loop state), the voltage at the output terminal OUT is either the first supply voltage VDD or the second supply voltage VSS due to a difference in voltage between the two input terminals IN− and IN+(in a period of time other than an output voltage transition period).

When the output terminal OUT is connected to the second input terminal IN−, the amplifier of FIG. 2 may function as a buffer, and the voltage at the output terminal OUT follows the voltage at the first input terminal IN+. The following description is based on the amplifier shown in FIG. 2 operating as a buffer.

In order for the voltage at the output terminal OUT having the second supply voltage VSS to increase to the first supply voltage VDD, the voltage at the first input terminal IN+ must be higher than the current voltage at the output terminal OUT. As a result, the first conversion voltage PU decreases, and a difference in voltage between the first conversion voltage PU and the first supply voltage VDD increases.

Referring to FIG. 2, when the voltage at the output terminal OUT increases from a low level to a high level (rising edge), the voltage on the third node N3 increases, whereby the voltage at the pull-up terminal PU decreases, and therefore Vgs (a difference in voltage between the gate and the source) of the fifteenth transistor M15 increases. When the voltage on the third node N3 increases rapidly (e.g., at the edge of a rising transition in the output voltage), the slew rate of the rising edge may improve.

In the present invention, the slew rate improvement circuit 150 may rapidly raise the voltage on the third node N3 during a rising edge of an output voltage transition and rapidly lower the voltage on the sixth node N6 at a falling edge of an output voltage transition.

For convenience of description, it is assumed that the second input terminal IN− of the amplifier according to the present invention is coupled to the output terminal OUT to form a buffer.

When the voltage at the output terminal OUT increases, it may mean that the voltage at the first input terminal IN+ has increased.

When the voltage at the third transistor M3 (e.g., the first input terminal IN+) increases, the amount of current that flows through the third transistor M3 increases, whereby the voltage on the second AC ground node Nt, which is another terminal of the third transistor M3, increases. In the same manner, when the voltage at the sixth transistor M6 in the first input terminal IN+ increases, the amount of current that flows through the sixth transistor M6 decreases, whereby the voltage on the first AC ground node Pt, which is another terminal of the sixth transistor M6, increases.

In contrast, when the voltage at the output terminal OUT decreases, it may mean that the voltage at the first input terminal IN+ decreases.

When the voltage at the third transistor M3 (e.g., at the first input terminal IN+) decreases, the amount of current that flows through the third transistor M3 decreases, whereby the voltage on the second AC ground node Nt, which is another terminal of the third transistor M3, decreases. In the same manner, when the voltage at the sixth transistor M6 (e.g., at the first input terminal IN+) decreases, the amount of current that flows through the sixth transistor M6 increases, whereby the voltage on the first AC ground node Pt, which is another terminal of the sixth transistor M6, decreases.

In brief, the voltages on the first AC ground node Pt and the second AC ground node Nt increase at the edge of a rising output voltage transition, and the voltages on the first AC ground node Pt and the second AC ground node Nt decrease at the edge of a falling output voltage transition.

When the first AC ground node Pt is coupled to the third node N3 using the first slew rate improvement capacitor cs1, and the second AC ground node Nt is coupled to the sixth node N6 using the second slew rate improvement capacitor cs2, the first slew rate improvement capacitor cs1 and the second slew rate improvement capacitor cs2 are short-circuited at the transition point of the output voltage, whereby the increased voltages on the first AC ground node Pt and the second AC ground node Nt boost an increase in the voltages on the third node N3 and the sixth node N6, and therefore, a drop in the first conversion voltage PU and the second conversion voltage PD accelerate.

In the same manner, the decrease in the voltages of the first AC ground node Pt and the second AC ground node Nt at the edge of the falling output voltage transition boosts a drop in the voltages on the third node N3 and the sixth node N6, and therefore, the increase in the first conversion voltage PU and the second conversion voltage PD accelerates.

Figure 3:
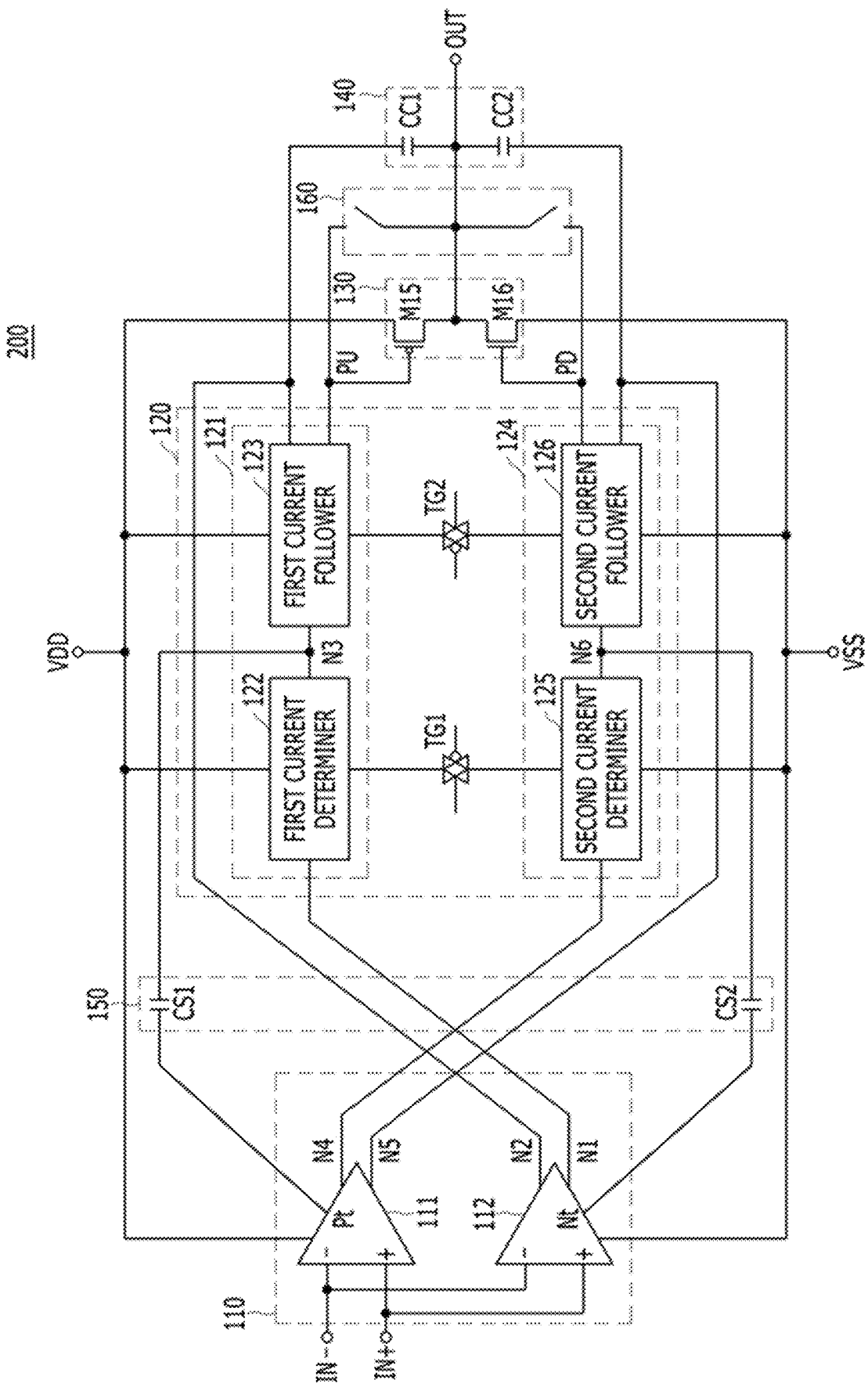
FIG. 3 shows another embodiment of the amplifier according to the present invention.

FIG. 3 shows another embodiment of the amplifier according to the present invention.

Referring to FIG. 3, the amplifier 200 according to the present invention includes an input unit 110, a conversion unit 120, an amplification unit 130, a frequency compensation circuit 140, a second slew rate improvement circuit 150, and a first slew rate improvement circuit 160.

The input unit 110, the conversion unit 120, the amplification unit 130, the frequency compensation circuit 140, and the second slew rate improvement circuit 150 are identical to the circuit shown in FIG. 2, and therefore a description thereof will be omitted.

The first slew rate improvement circuit 160 improves a slew rate of the output voltage using a switching element configured to reversibly connect the output terminal OUT of the amplification unit 130 and the input terminals IN− and IN+ of the amplification unit 130 for a predetermined time during which the output voltage transitions in response to the first input voltage IN+ at the first input terminal IN+. Various switching elements may be used. Hereinafter, a transistor is used as an example.

FIG. 4 shows an exemplary circuit of the amplifier shown in FIG. 3.

Referring to FIG. 4, the amplifier 200 according to the present invention includes an input unit 110, a conversion unit 120, an amplification unit 130, a frequency compensation circuit 140, a second slew rate improvement circuit 150, and a first slew rate improvement circuit 160.

Since the input unit 110, the conversion unit 120, the amplification unit 130, the frequency compensation circuit 140, and the second slew rate improvement circuit 150 are identical in construction to the circuit shown in FIG. 2, as described above, only the construction of the first slew rate improvement circuit 160 will be described.

The first slew rate improvement circuit 160 may comprise two transistors M17 and M18 configured respectively to reversibly connect the output terminal OUT to the pull-up terminal PU and the pull-down terminal PD in response to the first input voltage IN+.

One terminal of the seventeenth transistor M17 is connected to the pull-up terminal PU, another terminal of the seventeenth transistor M17 is connected to the output terminal OUT, and the first input voltage IN+ is applied to or received at a gate of the seventeenth transistor M17. One terminal of the eighteenth transistor M18 is connected to the pull-down terminal PD, another terminal of the eighteenth transistor M18 is connected to the output terminal OUT, and the first input voltage IN+ is applied to or received at a gate of the eighteenth transistor M18.

Referring to FIG. 4, both transistors M17 and M18 in the first slew rate improvement circuit 160 are operated in response to the first input voltage IN+. When a difference between the first input voltage IN+ and the voltage at the output terminal OUT is equal to or greater than the threshold voltage Vth of the two transistors M17 and M18, the transistors M17 and M18 are turned on to connect the output terminal OUT and the pull-up terminal PU and the pull-down terminal PD, respectively, thereby improving the slew rate of the output signal at the output terminal OUT.

After a slew rate improvement process is performed during the period in which the difference between the first input voltage IN+ and the voltage at the output terminal OUT is equal to or greater than the threshold voltages Vth of the two transistors M17 and M18, the two transistors M17 and M18 are turned off when the difference between the first input voltage IN+ and the voltage at the output terminal OUT is less than the threshold voltage Vth of the two transistors M17 and M18.

Figure 5:
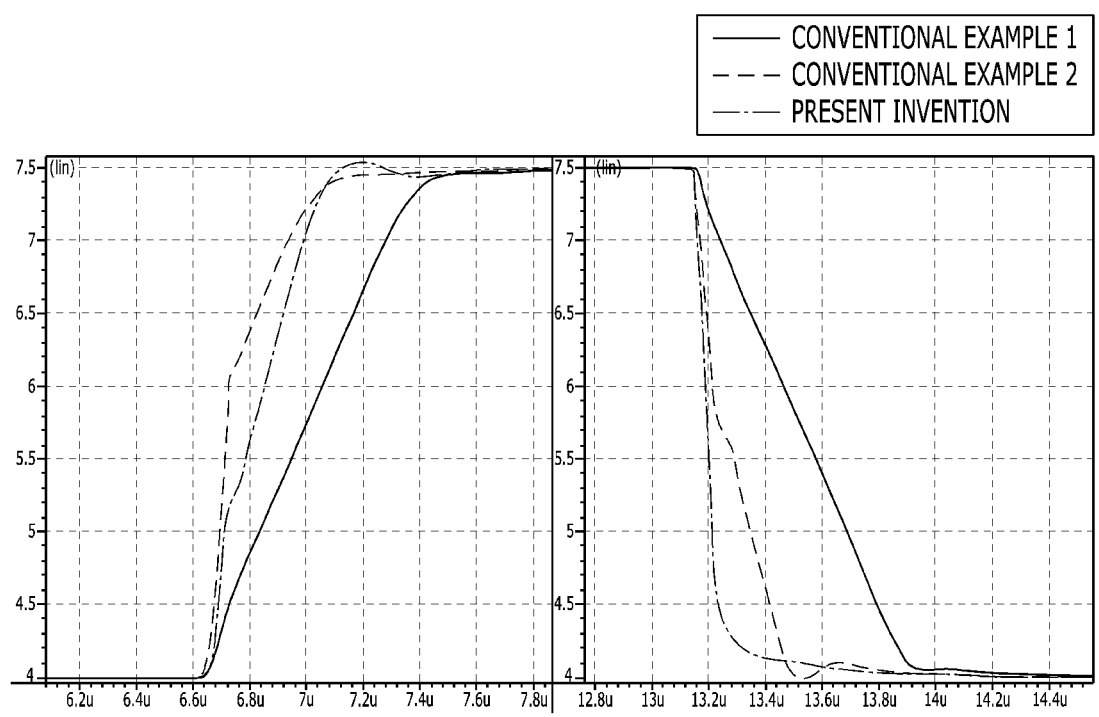
FIG. 5 is a graph showing a comparison in electrical properties between conventional buffers and a buffer according to the present invention.

FIG. 5 shows a comparison in electrical properties between conventional buffers and a buffer according to the present invention.

In FIG. 5, conventional example 1 is an example of a circuit in which no special measures have been taken to improve the slew rate, and conventional example 2 is an example of a circuit in which special measures have been taken to improve the slew rate. Although not shown, the circuit of conventional example 2 has a switch configured to connect one terminal of the compensation capacitor cc1 and one terminal of the compensation capacitor cc2 shown in FIGS. 2 and 4 to two different nodes, and therefore the circuit is more complicated and has higher power consumption than in the present invention.

Referring to FIG. 5, it can be seen that electrical characteristics OUT (which may be the slew rate, or voltage as a function of time during a signal transition) during the rising and falling transitions of the output signal from the amplifier according to the present invention are improved, compared to conventional examples 1 and 2.

As previously described, the amplifier shown in FIGS. 1 to 4 may be used as a buffer when the output terminal OUT and the second input terminal IN− are coupled to each other. The amplifier according to the present invention may be used in a source driver circuit of a liquid crystal display device as a buffer. The source driver circuit of the liquid crystal display device includes a latch circuit configured to store data and a level shifter configured to change the voltage of the data (e.g., output from the latch circuit). The source driver circuit converts a digital value of the level shifted data into an analog signal, and supplies the analog signal to a data line using the buffer.

As is apparent from the above description, an amplifier according to the present invention has an advantage in that it is possible to improve a slew rate without increasing power consumption while using a small or minimum number of elements.

It should be noted that the effects of the present invention are not limited to the effects mentioned above, and other unmentioned effects will be clearly understood by those skilled in the art from the above description.

While the technical idea of the present invention has been described with reference to the accompanying drawings, this illustratively describes preferred embodiments of the present invention, not restricts the present invention. In addition, a person having ordinary skill in the art to which the present invention pertains will appreciate that various modifications and alterations are possible without departing from the category of the technical idea of the present invention.

What is claimed is:

1. An amplifier comprising:
   an input unit configured to receive a differential input signal at a first input terminal and a second input terminal, the input unit comprising a first input stage having a first AC ground node therein and a second input stage having a second AC ground node therein;
   a conversion unit comprising a first current mirror comprising a first current determiner and a first current follower configured to operate in response to a voltage or current on a first current determination and/or voltage generation node of the first current determiner, a second current mirror comprising a second current determiner and a second current follower configured to operate in response to a voltage or current on a second current determination and/or voltage generation node of the second current determiner, a first transmission gate between the first current determiner and the second current determiner, and a second transmission gate between the first current follower and the second current follower, the conversion unit being configured to provide a first conversion voltage and a second conversion voltage that vary in response to the differential signal at the input unit;
   an amplification unit configured to provide an output voltage in response to the first conversion voltage and the second conversion voltage;
   a frequency compensation circuit comprising (i) a first compensation capacitor between an output terminal and the first current follower and (ii) a second compensation capacitor between the output terminal and the second current follower; and
   a slew rate improvement circuit comprising a first slew rate improvement capacitor between the first current determination and/or voltage generation node and the first AC ground node and a second slew rate improvement capacitor between the second current determination and/or voltage generation node and the second AC ground node.

2. The amplifier according to claim 1, wherein voltages on the first AC ground node and the second AC ground node increase and decrease in an amount equal to a respective increase and decrease in voltage at the first input terminal.

3. The amplifier according to claim 2, wherein
   voltages on the first current determination and/or voltage generation node and the second current determination and/or voltage generation node increase during a rising transition of the output voltage, and
   the voltages on the first current determination and/or voltage generation node and the second current determination and/or voltage generation node decrease during a falling transition of the output voltage.

4. The amplifier according to claim 1, wherein
   the first current determiner comprises:
   a seventh transistor having one terminal receiving a first supply voltage and another terminal connected to a first node; and a ninth transistor having one terminal connected to the first node, a gate configured to receive a third bias voltage is applied, and another terminal connected to a gate of the seventh transistor and one terminal of the first transmission gate, wherein the other terminal of the ninth transistor is the first current determination and/or voltage generation node, the first current follower comprises:
an eighth transistor having one terminal receiving the first supply voltage, another terminal connected to a second node, and a gate connected to the first current determination and/or voltage generation node; and
a tenth transistor having one terminal connected to the second node, a gate configured to receive the third bias voltage, and another terminal configured to provide the first conversion voltage and connected to one terminal of the second transmission gate, and the second node is connected to one terminal of the first compensation capacitor.

5. The amplifier according to claim 4, wherein
the second current determiner comprises:
an eleventh transistor having one terminal connected to another terminal of the first transmission gate and a gate configured to receive a fourth bias voltage, wherein the one terminal of the eleventh transistor is the second current determination and/or voltage generation node; and
a thirteenth transistor having one terminal connected to another terminal of the eleventh transistor, another terminal receiving a second supply voltage, and a gate connected to the second current determination and/or voltage generation node, the second current follower comprises:
a twelfth transistor having one terminal, configured to provide the second conversion voltage, connected to another terminal of the second transmission gate, a gate configured to receive the fourth bias voltage, and another terminal connected to a fifth node; and
a fourteenth transistor having one terminal connected to the fifth node, a gate connected to the second current determination and/or voltage generation node, and another terminal receiving the second supply voltage, and the fifth node is connected to one terminal of the second compensation capacitor.

6. The amplifier according to claim 5, wherein
the first input stage comprises:
a first transistor having one terminal receiving the first supply voltage and a gate configured to receive a first bias voltage;
a fifth transistor having one terminal connected to another terminal of the first transistor, another terminal connected to the fourth node, and a gate connected to the second input terminal; and
a sixth transistor having one terminal connected to another terminal of the first transistor, another terminal connected to the fifth node, and a gate connected to the first input terminal, and the first AC ground node is a common terminal of the first transistor, the fifth transistor, and the sixth transistor.

7. The amplifier according to claim 6, wherein
the second input stage comprises:
a fourth transistor having one terminal receiving the second supply voltage, a gate configured to receive a second bias voltage, and another terminal connected to the second AC ground node;
a second transistor having one terminal connected to the first node, a gate connected to the second input terminal, and another terminal connected to the second AC ground node; and
a third transistor having one terminal connected to the second node, a gate connected to the first input terminal, and another terminal connected to the second AC ground node, and the second AC ground node is a common terminal of the second transistor, the third transistor, and the fourth transistor.

8. The amplifier according to claim 5, wherein
each of the first current determiner and the first current follower comprises a P-type transistor, and
each of the second current determiner and the second current follower comprises an N-type transistor.

9. The amplifier according to claim 7, wherein
each of the first transistor to the third transistor comprises a P-type transistor, and
each of the fourth transistor to the sixth transistor comprises an N-type transistor.

10. An amplifier comprising:
an input unit configured to receive a differential input signal at a first input terminal and a second input terminal, the input unit comprising a first input stage having a first AC ground node therein and a second input stage having a second AC ground node therein;
a conversion unit comprising a first current mirror comprising a first current determiner and a first current follower configured to operate in response to a voltage or current on a first current determination and/or voltage generation node of the first current determiner, a second current mirror comprising a second current determiner and a second current follower configured to operate in response to a voltage or current on a second current determination and/or voltage generation node of the second current determiner, a first transmission gate between the first current determiner and the second current determiner, and a second transmission gate between the first current follower and the second current follower, the conversion unit being configured to provide a first conversion voltage and a second conversion voltage that vary in response to the differential signal at the input unit;
an amplification unit configured to provide an output voltage in response to the first conversion voltage and the second conversion voltage;
a frequency compensation circuit comprising (i) a first compensation capacitor between an output terminal and the first current follower and (ii) a second compensation capacitor between the output terminal and the second current follower;
a first slew rate improvement circuit comprising a switching element configured to reversibly connect each of a first terminal configured to output the first conversion voltage and a second terminal configured to output the second conversion voltage to the output terminal for a predetermined time during which the output voltage transitions in response to the input voltage at the first input terminal; and
a second slew rate improvement circuit comprising a first slew rate improvement capacitor between the first current determination and/or voltage generation node and the first AC ground node and a second slew rate improvement capacitor between the second current determination and/or voltage generation node and the second AC ground node.

11. The amplifier according to claim 10, wherein voltages on the first AC ground node and the second AC ground node increase and decrease in an amount equal to a respective increase and decrease in voltage at the first input terminal.

12. The amplifier according to claim 11, wherein
voltages on the first current determination and/or voltage generation node and the second current determination and/or voltage generation node increase during a rising transition of the output voltage, and
the voltages on the first current determination and/or voltage generation node and the second current determination and/or voltage generation node decrease in a falling transition of the output voltage.

13. The amplifier according to claim 10, wherein
the first current determiner comprises:
a seventh transistor having one terminal receiving a first supply voltage and another terminal connected to a first node; and
a ninth transistor having one terminal connected to the first node, a gate configured to receive a third bias voltage, and another terminal connected to a gate of the seventh transistor and one terminal of the first transmission gate, wherein the other terminal of the ninth transistor is the first current determination and/or voltage generation node,
the first current follower comprises:
an eighth transistor having one terminal receiving the first supply voltage, another terminal connected to a second node, and a gate connected to the first current determination and/or voltage generation node; and
a tenth transistor having one terminal connected to the second node, a gate configured to receive the third bias voltage, and another terminal configured to provide the first conversion voltage and connected to one terminal of the second transmission gate, and
the second node is connected to one terminal of the first compensation capacitor.

14. The amplifier according to claim 13, wherein
the second current determiner comprises:
an eleventh transistor having one terminal connected to another terminal of the first transmission gate and a gate configured to receive a fourth bias voltage, wherein the one terminal of the eleventh transistor is the second current determination and/or voltage generation node; and
a thirteenth transistor having one terminal connected to another terminal of the eleventh transistor, another terminal receiving a second supply voltage, and a gate connected to the second current determination and/or voltage generation node,
the second current follower comprises:
a twelfth transistor having one terminal, configured to provide the second conversion voltage, connected to another terminal of the second transmission gate, a gate configured to receive the fourth bias voltage, and another terminal connected to a fifth node; and
a fourteenth transistor having one terminal connected to the fifth node, a gate connected to the second current determination and/or voltage generation node, and another terminal receiving the second supply voltage, and the fifth node is connected to one terminal of the second compensation capacitor.

15. The amplifier according to claim 14, wherein
the first input stage comprises:
a first transistor having one terminal receiving the first supply voltage and a gate configured to receive a first bias voltage;
a fifth transistor having one terminal connected to another terminal of the first transistor, another terminal connected to the fourth node, and a gate connected to the second input terminal; and
a sixth transistor having one terminal connected to another terminal of the first transistor, another terminal connected to the fifth node, and a gate connected to the first input terminal, and
the first AC ground node is a common terminal of the first transistor, the fifth transistor, and the sixth transistor.

16. The amplifier according to claim 15, wherein
the second input stage comprises:
a fourth transistor having one terminal receiving the second supply voltage, a gate configured to receive a second bias voltage, and another terminal connected to the second AC ground node;
a second transistor having one terminal connected to the first node, a gate connected to the second input terminal, and another terminal connected to the second AC ground node; and
a third transistor having one terminal connected to the second node, a gate connected to the first input terminal, and another terminal connected to the second AC ground node, and
the second AC ground node is a common terminal of the second transistor, the third transistor, and the fourth transistor.

17. The amplifier according to claim 14, wherein
each of the first current determiner and the first current follower comprises a P-type transistor, and
each of the second current determiner and the second current follower comprises an N-type transistor.

18. The amplifier according to claim 16, wherein
each of the first transistor to the third transistor comprises a P-type transistor, and
each of the fourth transistor to the sixth transistor comprises an N-type transistor.

19. The amplifier according to claim 10, wherein the first slew rate improvement circuit comprises:
a seventeenth transistor having one terminal to which the first conversion voltage is applied, another terminal connected to the output terminal, and a gate configured to receive a first input voltage; and
an eighteenth transistor having one terminal configured to receive the second conversion voltage, another terminal connected to the output terminal, and a gate configured to receive the first input voltage.

20. A source driver circuit using a buffer implemented by connecting the output terminal of the amplifier according to claim 1 to the second input terminal.

* * * * *